(12) United States Patent
Kadota et al.

(10) Patent No.: US 6,946,930 B2
(45) Date of Patent: *Sep. 20, 2005

(54) SURFACE ACOUSTIC WAVE DEVICE AND ELECTRONIC DEVICE USING THE SAME

(75) Inventors: Michio Kadota, Kyoto (JP); Takeshi Nakao, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/132,280

(22) Filed: Apr. 26, 2002

(65) Prior Publication Data

US 2002/0171512 A1 Nov. 21, 2002

(30) Foreign Application Priority Data

Apr. 27, 2001 (JP) ........................................ 2001-132655

(51) Int. Cl.$^7$ ................................................ H03H 9/64
(52) U.S. Cl. .................... 333/195; 333/196; 310/313 B; 310/361
(58) Field of Search ................................ 333/195, 196; 310/313 A, 313 B, 313 D, 313 R, 360, 361

(56) References Cited

U.S. PATENT DOCUMENTS

| | | | | |
|---|---|---|---|---|
| 4,965,479 A | * | 10/1990 | Elliott et al. | 310/313 D |
| 5,426,340 A | * | 6/1995 | Higaki et al. | 310/313 R |
| 5,814,917 A | * | 9/1998 | Isobe et al. | 310/313 B |
| 5,895,996 A | * | 4/1999 | Takagi et al. | 310/313 R |
| 5,953,433 A | * | 9/1999 | Fujimoto et al. | 381/337 |
| 5,965,969 A | * | 10/1999 | Kadota | 310/313 R |
| 6,154,105 A | * | 11/2000 | Fujimoto et al. | 333/194 |

FOREIGN PATENT DOCUMENTS

| JP | 63-198410 | 8/1988 |
|---|---|---|
| JP | 2000-323956 | 11/2000 |

OTHER PUBLICATIONS

Michio Kadota et al., "Small–Sized Resonator Filter using Love Type SH SAW on Quartz", Operational Committee for the 21st Symposium of Basics and Application of Ultrasonic Electronics, Nov. 6, 2000, pp. 59–60.
Japanese Examination Report (Final Rejection) Corresponding to Japanese Patent Application No. 2001–132655; "Surface Acoustic Wave Filter"; Japanese Examination Report was dispatched on Oct. 21, 2003.

* cited by examiner

Primary Examiner—Timothy P. Callahan
Assistant Examiner—An T. Luu
(74) Attorney, Agent, or Firm—Keating & Bennett, LLP (57) ABSTRACT

A reliable SAW device has excellent reflection and a small size, which is achieved by reducing the number of fingers defining reflectors, such that losses due to a large electromechanical coupling coefficient are small and the film thickness of electrodes has much less effect on frequencies of the device. In the SAW device having pluralities of first fingers and second fingers, disposed on a quartz substrate, constituting an IDT for exciting SH waves and reflectors for reflecting the SH waves, respectively, the first and second fingers made mainly from Al are disposed on the ST-cut 90° X-propagation quartz substrate with the Euler angles (0°, θ, 90°±2°), wherein the angle θ is within the range of about 110° to about 150°, and a normalized film thickness (H/λ) of the fingers is within in the range of about 0.025 to about 0.135.

18 Claims, 9 Drawing Sheets

SURFACE ACOUSTIC WAVE DEVICE AND ELECTRONIC DEVICE USING THE SAME

BACKGROUND OF THE INVENTION

1. Field of the Invention

The present invention relates to surface acoustic wave devices (hereinafter, the term "surface acoustic wave" is abbreviated as SAW) such as SAW resonators, SAW filters, and duplexers, and more particularly, the present invention relates to a SAW device using shear-horizontal waves (hereinafter, abbreviated as SH waves).

2. Description of the Related Art

SAW filters have been widely used for band-pass filters of mobile communication devices and other electronic apparatuses. Such known SAW filters include SAW resonator filters and transversal filters.

An exemplary known SAW resonator filter is configured such that an ST-cut 0° X-propagation quartz substrate having excellent temperature characteristics has an interdigital transducer (hereinafter, abbreviated as an IDT) and reflectors disposed thereon. The IDT and the reflectors are both made from an Al electrode material, and use Rayleigh waves produced by excitation of the IDT.

Another exemplary known SAW filter is configured such that an ST-cut 90° X-propagation quartz substrate has an IDT and reflectors disposed thereon. The IDT and the reflectors are both made from an electrode material such as Ta, W, and Au, and use SH waves produced by excitation of the IDT (refer to Japanese Patent Unexamined Application Publication No. 2000-323956, for example).

The former of the two SAW resonator filters described above, which is provided with Al electrodes on an ST-cut 0° X-propagation quartz substrate and which uses Rayleigh waves, causes the following problems:

(1) difficulty in reducing the filter size because of a small reflection coefficient, resulting in the need for a large number of fingers for reflectors in the SAW resonator filter and in a device such as a SAW resonator; and
(2) large losses due to a small electromechanical coupling coefficient.

On the other hand, the latter of the two foregoing SAW resonator filters, which is provided with electrodes made from a heavy metal such as Ta, W, and Au disposed on an ST-cut 90° X-propagation quartz substrate and which uses SH waves, has the advantages of a large electromechanical coupling coefficient and a large reflection coefficient, and thus the advantage of a reduced filter size.

However, using the latter filter, which is provided with electrodes made from a heavy metal such as Ta, W, and Au, gives rise to problems such as a large variation in the central frequencies of the filter caused by a variation in the width and thickness of the electrodes, and consequently the reject ratio is large. That is to say, since the heavier the metals for the electrodes are, the more sharply the acoustic speeds in the metals vary with respect to a change in the film thickness thereof compared to that in light Al, the latter filter has a problem of a large variation in the central frequencies even when the electrodes made from the heavy metal material have substantially the same variations in width and thickness as those of the corresponding light Al electrodes.

One way to reduce such a variation in the central frequencies is to increase the thickness of the light Al to such a degree that SH waves can be excited. However, it is difficult to increase the film thickness of an IDT film to a degree where SH waves are excited because of the limited thickness of the resist film and a strain in the resist film caused by heat with current thin-film forming technologies.

SUMMARY OF THE INVENTION

In order to overcome the problems described above, preferred embodiments of the present invention provide a reliable SAW device and a reliable electronic device including such a SAW device, both having an excellent reflection and a small size realized by reducing the number of fingers used to define reflectors, wherein losses caused by a large electromechanical coupling coefficient are minimized and very small, and an electrode thickness has much less effect on frequencies of the SAW device.

According to preferred embodiments of the present invention, a surface acoustic wave (hereinafter, the term "surface acoustic wave" is abbreviated as SAW) device includes a quartz substrate, a plurality of first fingers, disposed on the quartz substrate, constituting an interdigital transducer (hereinafter, abbreviated as an IDT) for exciting shear-horizontal waves (hereinafter, abbreviated as SH waves), and a plurality of second fingers, disposed on the quartz substrate, constituting reflectors for reflecting the SH waves. The quartz substrate is preferably a ST-cut 90° X-propagation quartz substrate with the Euler angles (0°, θ, 90°±2°), wherein the angle θ lies in the range of about 110° to about 150°, and the first and second fingers are made of a material including Al as a main component, and a normalized film thickness (H/λ) of the first and second fingers is within the range of about 0.025 to about 0.135.

By disposing the fingers made mainly from Al on the ST-cut 90° X-propagation quartz substrate with the Euler angles (0°, θ, 90°±2°), there is provided a reliable SAW device having an excellent reflection and a large electromechanical coupling coefficient, wherein an effect of an electrode thickness on frequencies of the SAW device is very small and also losses are very small when the normalized film thickness (H/λ) of the fingers is within the range of about 0.025 to about 0.135 and the angle θ lies in the range of about 110° to about 150°.

That is to say, the SAW device according to preferred embodiments of the present invention has a reflection index per finger that is about three times or greater than that of a comparative SAW device having Al electrodes and using X-propagation Rayleigh waves, allowing the reflectors to have a substantially reduced size. Thus, the SAW device has a sufficiently reduced overall size.

Also, the SAW device has an electromechanical coupling coefficient that is larger by a factor of about 1.5 or more and an electric resistance that is smaller than that of the comparative SAW device. Accordingly, the SAW device has smaller losses and can be used over a wider range of operating frequencies.

Moreover, the SAW device has smaller losses owing to a smaller electric resistance of the electrodes and less dependence of an acoustic speed on the thickness of the electrodes by a factor of about 1/7 to about 1/10, than those of a know SAW device having electrodes made from any one of heavy metals such as Ta, W, and Au, and using 90° X-propagation SH waves, thus reducing variation in the central frequencies of the device.

In addition, the SAW device according to preferred embodiments of the present invention has excellent properties when the device includes a unidirectional electrode.

In the SAW device according to preferred embodiments of the present invention, the normalized film thickness (H/λ) of the first and second fingers is preferably within the range of about 0.045 to about 0.095.

By configuring the fingers so as to have a normalized film thickness (H/λ) in the range of about 0.045 to about 0.095, the SAW device according to preferred embodiments of the present invention has an electromechanical coupling coefficient that is about two times or greater than that of the comparative SAW device, thereby achieving smaller losses and becoming available over a wider range of operating frequencies.

Also, the above configuration allows the SAW device to have a reflective index per finger that is substantially equal to 10% or larger, achieving a reflective index of about 99% or larger by providing the reflectors with about 40 fingers, and thus resulting in a device with a greatly reduced overall size.

In the SAW device according to preferred embodiments of the present invention, the normalized film thickness (H/λ) of the first and second fingers is preferably at least about 0.06.

By configuring the fingers so as to have a normalized film thickness (H/λ) of about 0.06 or larger, the SAW device according to preferred embodiments of the present invention has an improved reflective index per finger of about 15% or more, thereby achieving a further reduced size realized by reducing the number of fingers of the reflectors. For example, the SAW device has a reflective index of about 99% or more by providing the reflectors with about 30 fingers.

In the SAW device according to preferred embodiments of the present invention, the normalized film thickness (H/λ) of the first and second fingers is preferably at least about 0.10.

By configuring the fingers to have a normalized film thickness (H/λ) of about 0.10 or larger, the SAW device according to preferred embodiments of the present invention has an improved reflective index per finger of about 35% or more, thus the same reduced size as that of an end surface reflection-type SAW device can be substantially achieved. For example, the SAW device has a reflective index of about 99% or more by providing the reflectors with about 10 fingers.

In the surface acoustic wave according to preferred embodiments of the present invention, the angle θ of the Euler angles preferably satisfies the following condition:

$$\theta min \leq \theta \leq \theta max$$

where, $\theta max = 3303.6 \ (H/\lambda)^2 - 71.786 \ (H/\lambda) + 130.5$ and $\theta min = 2747.8 \ (H/\lambda)^2 - 72.4 \ (H/\lambda) + 121.5$.

Figure 9:
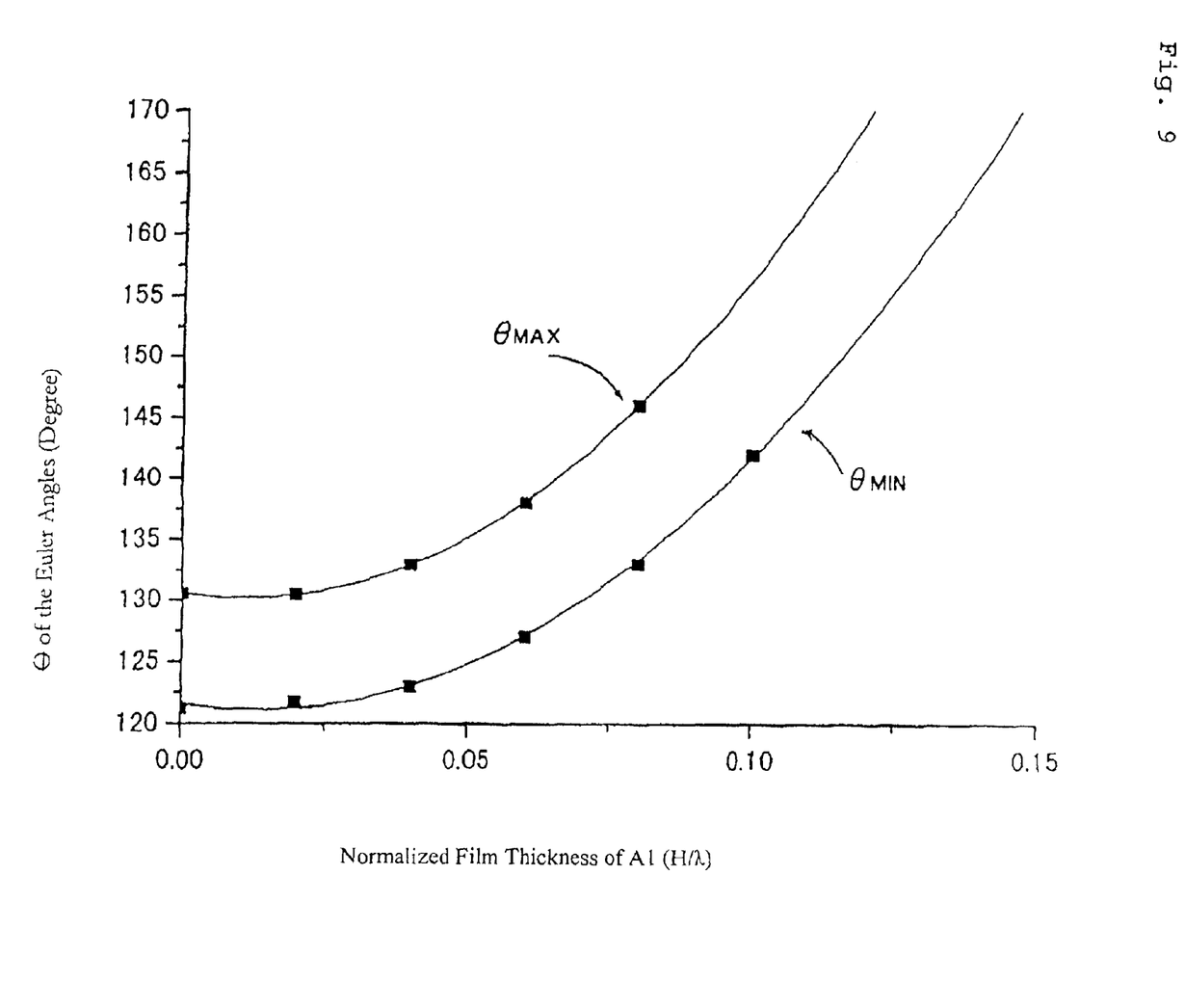
FIG. 9 is a graph illustrating the relationship between angle θ of the Euler angles and normalized film thickness (H/λ) for providing the range of excellent frequency temperature coefficients.

By satisfying the above condition, that is, by allowing the angle θ to be between the θmin and θmax indicated in FIG. 9, the SAW device according to preferred embodiments of the present invention has an excellent frequency temperature coefficient.

According to preferred embodiments of the present invention, an electronic device includes at least one of a SAW resonator, a SAW resonator filter, a SAW ladder filter, a SAW lattice filter, and a unidirectional element, each including the SAW device according to preferred embodiments described above.

The SAW device according to preferred embodiments of the present invention can be used as a SAW resonator, a SAW resonator filter, a SAW ladder filter, a SAW lattice filter, or a unidirectional element, thus providing a small and high performance electronic device using the SAW device.

Other features, elements, characteristics and advantages of the present invention will become more apparent from the following detailed description of preferred embodiments of the present invention.

DETAILED DESCRIPTION OF PREFERRED EMBODIMENTS

Figure 1:
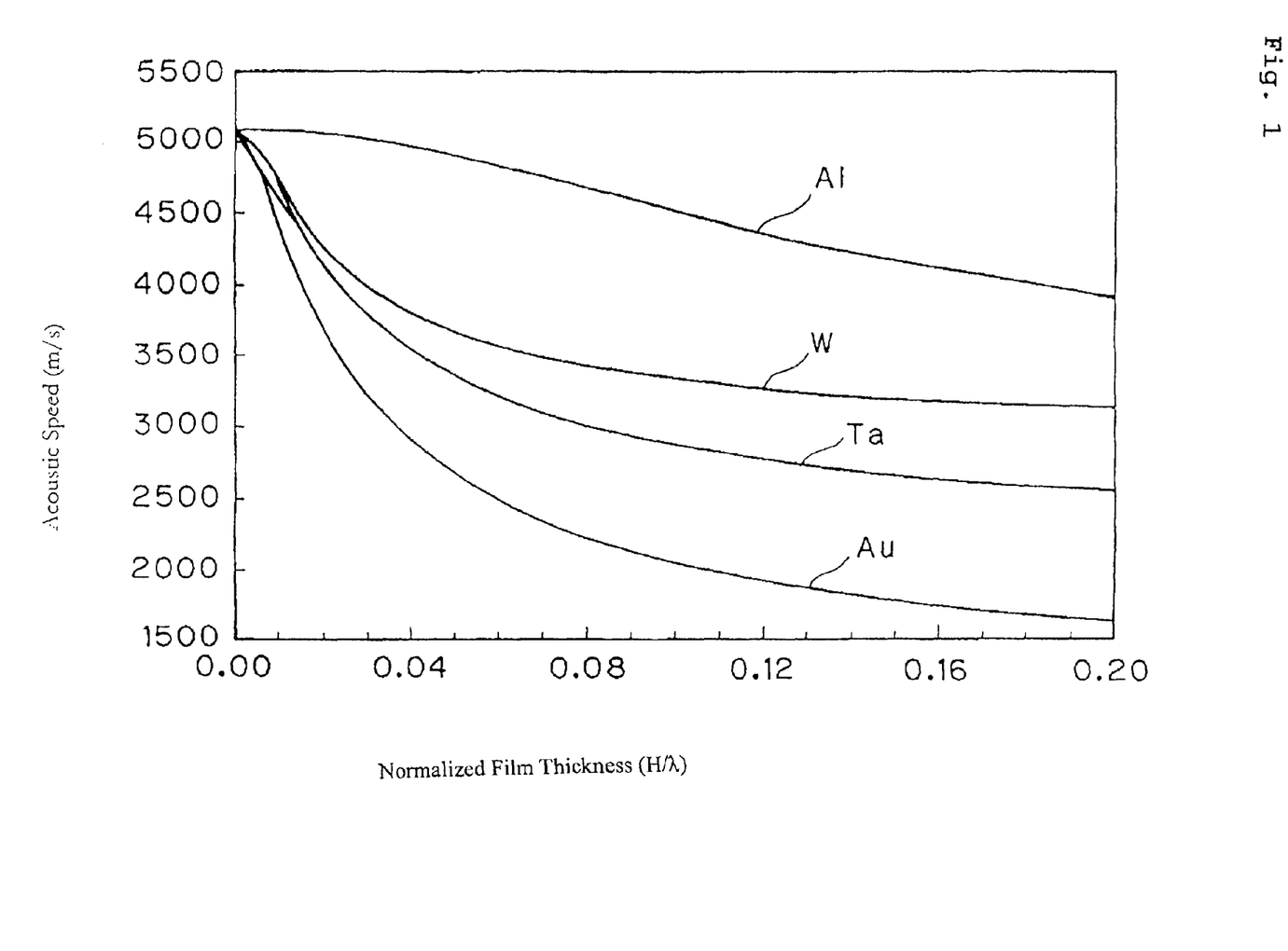
FIG. 1 is a graph illustrating the relationship between acoustic speed (SAW speed) and normalized film thickness (H/λ) of electrodes that are disposed on a quartz substrate and which are made from the metals Al, W, Ta, and Au, respectively.

FIG. 1 is a graph illustrating the relationship between surface acoustic speed (SAW speed) and normalized film thickness (H/λ) of electrodes that are disposed on an ST-cut 90° X-propagation quartz substrate (a 20–60° rotated Y-cut plate) with the Euler angles (0°, 110–150°, 90°±2°) and respectively, made from metals Al, W, Ta, and Au, where H and λ represent the thickness and the arrangement pitch of the electrodes, respectively.

FIG. 1 indicates that a SAW device provided with Al electrodes has a high acoustic speed (i.e., a high surface wave speed) and the acoustic speed is less dependent on changes in the film thickness of the electrodes, and also that a SAW device provided with electrodes made from any one of Au, Ta, and W, all being heavier than Al, has a slow acoustic speed and is strongly dependent on changes in the film thickness of the electrodes.

Accordingly, an Al electrode material allows electrodes to be less dependent on the film thickness, thereby achieving a SAW device having less frequency variation.

Figure 2:
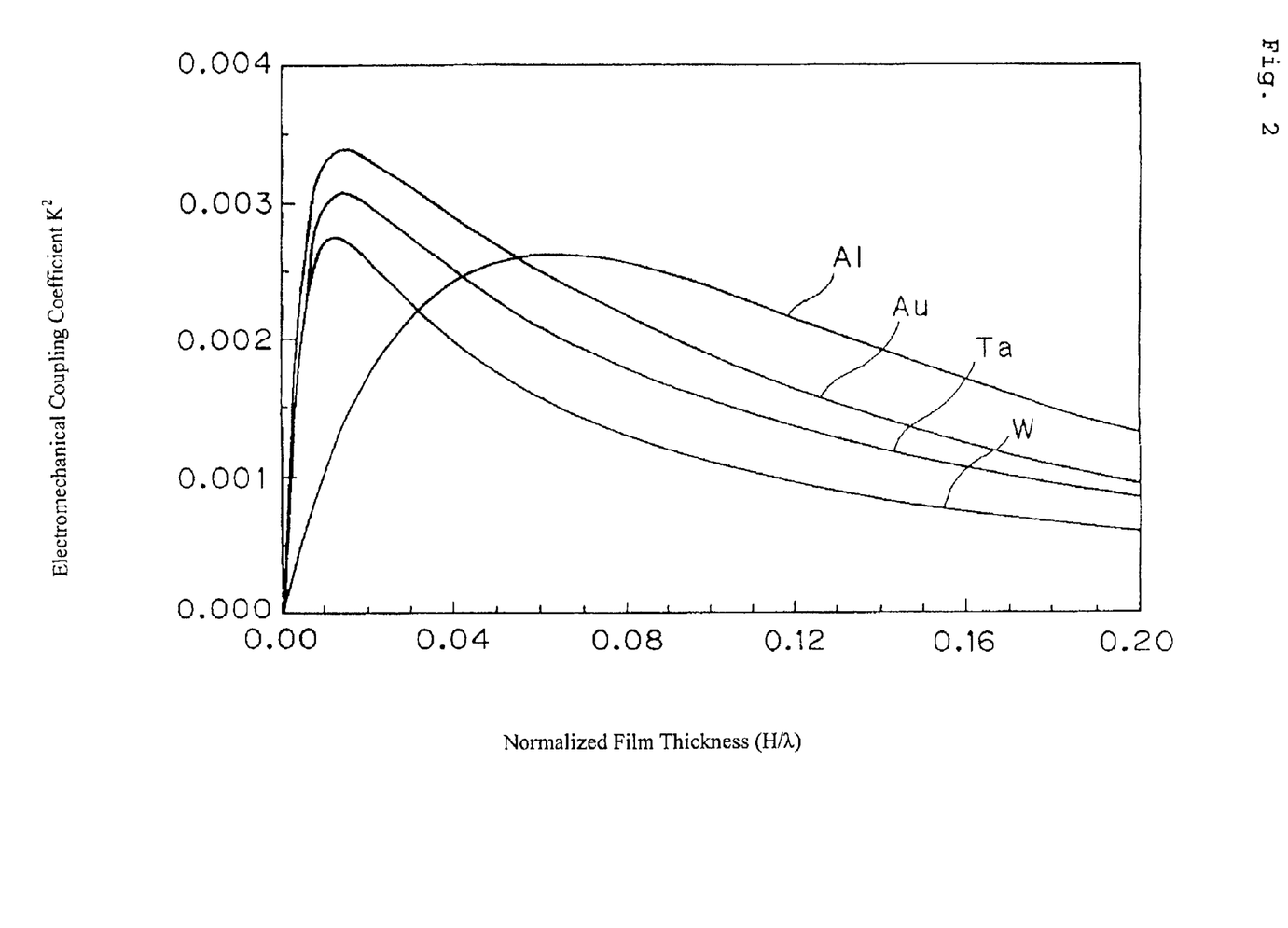
FIG. 2 is a graph illustrating the relationship between electromechanical coupling coefficient and normalized film thickness (H/λ) of electrodes that are disposed on a quartz substrate and which are made from the metals Al, W, Ta, and Au, respectively.

FIG. 2 is a graph illustrating the relationship between electromechanical coupling coefficient and normalized film thickness (H/λ) of electrodes that are disposed on an ST-cut 90° X-propagation quartz substrate (a 20–60° rotated Y-cut plate) with the Euler angles (0°, 110–150°, 90°±2°) and that are made from the metals Al, W, Ta, and Au, respectively.

FIG. 2 indicates that SAW devices provided with Al electrodes have a larger electromechanical coupling coefficient than that of SAW devices provided with electrodes made from any one of heavy metals Au, Ta, or W when the normalized film thickness (H/λ) exceeds about 0.05.

Accordingly, an Al electrode material allows a SAW device to have a large electromechanical coupling coefficient and small losses.

Figure 3:
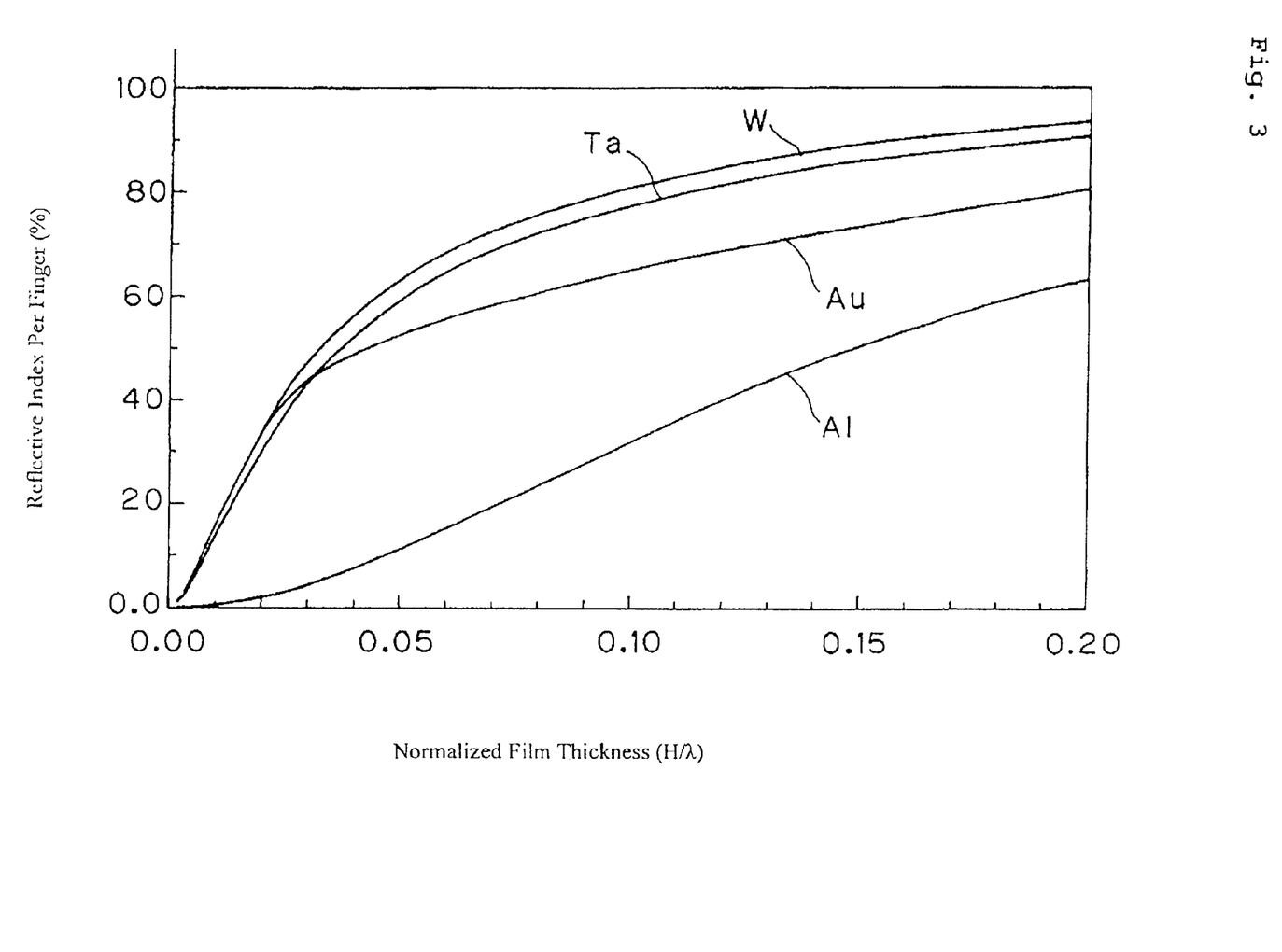
FIG. 3 is a graph illustrating the relationship between reflective index per finger and normalized film thickness (H/λ) of electrodes that are disposed on a quartz substrate and which are made from the metals Al, W, Ta, and Au, respectively.

FIG. 3 is a graph illustrating the relationship between reflective index per finger and normalized film thickness (H/λ) of electrodes that are disposed on an ST-cut 90° X-propagation quartz substrate (a 20–60° rotated Y-cut plate) with the Euler angles (0°, 110–150°, 90°±2°) and which are made from Al, W, Ta, and Au, respectively.

As shown in FIG. 3, SAW devices provided with light Al electrodes have a smaller reflective index per finger than that of SAW devices provided with electrodes made from any one of heavy metals Au, Ta, W. However, when the normalized film thickness (H/λ) is at least about 0.1 according to a preferred embodiment of the present invention, the reflection coefficient per finger of the former device exceeds about 30%, and thus, by providing several fingers, the device has a sufficient reflection index, and therefore the size can be significantly reduced.

Figure 4:
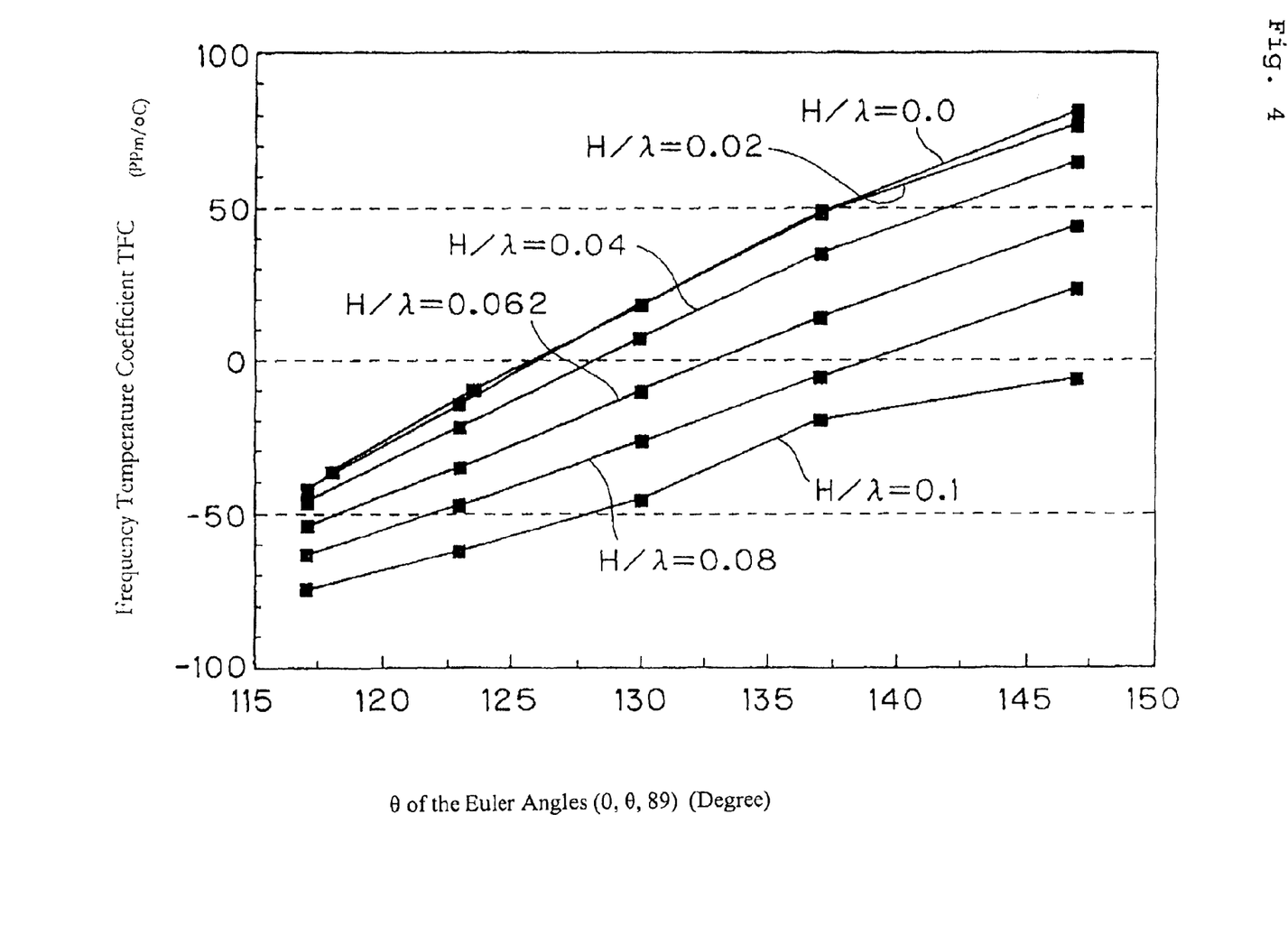
FIG. 4 is a graph illustrating the relationship between frequency temperature coefficient (TFC) and angle θ of the Euler angles (0°, θ, 90°), with another parameter of the normalized film thickness (H/λ) of Al electrodes formed on an ST-cut 90° degree X-propagation quartz substrate with the Euler angles (0°, θ, 89°)

FIG. 4 is a graph illustrating the relationship between frequency temperature coefficient (TFC) and angle θ of the Euler angles (0°, θ, 89°), with another parameter of the normalized film thickness (H/λ) of Al electrodes disposed on an ST-cut 90° X-propagation quartz substrate.

As shown in FIG. 4, the frequency temperature coefficient (TFC) is located mostly in the range of about −75 ppm/° C. to about +80 ppm/° C. when the angle θ lies in the range of about 115° to about 150°, thus allowing a SAW device to have an excellent frequency temperature coefficient.

Features of preferred embodiments according to the present invention will be described further in detail.

Figure 5A:
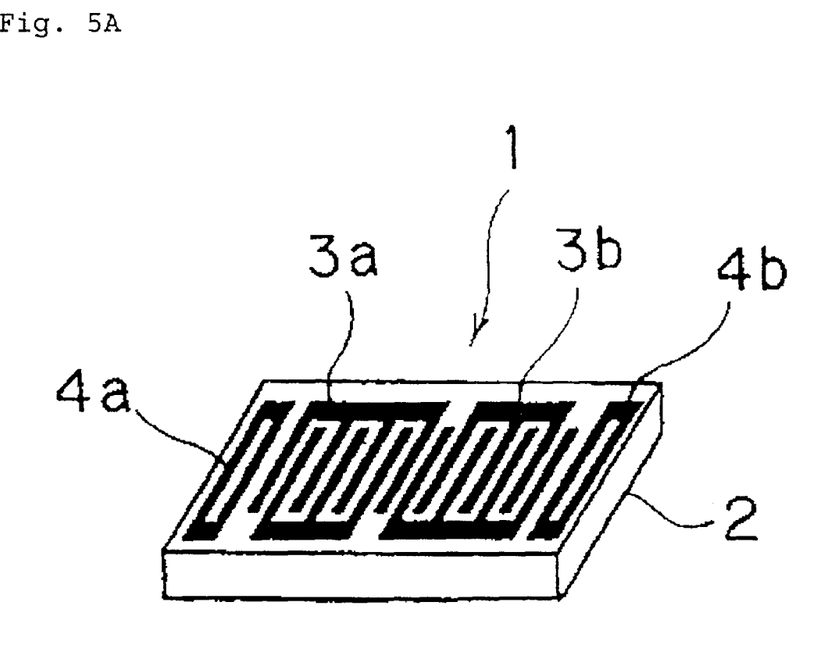
FIG. 5A and FIG. 5B are perspective views, respectively, schematically illustrating a longitudinally coupled resonator filter as a first exemplary SAW device according to a first preferred embodiment of the present invention and a known longitudinally coupled resonator filter (as a comparative example)

FIG. 5A is a perspective view schematically illustrating a longitudinally coupled resonator filter as a first exemplary SAW device according to a first preferred embodiment of the present invention.

As shown in FIG. 5A, the longitudinally coupled resonator filter 1 is configured such that two IDTs 3a and 3b for exciting SH waves are disposed on an ST-cut 90° X-propagation quartz substrate, i.e., piezoelectric substrate, (a 20–60° rotated Y-cut plate) 2 with the Euler angles (0°, 110–150°, 90°±2°) and two reflectors 4a and 4b for reflecting the SH waves are arranged so as to sandwich the IDTs 3a and 3b therebetween.

The IDTs 3a and 3b and the reflectors 4a and 4b are preferably made from an electrode material made mainly from Al. Each of the IDTs 3a and 3b has a pair of comb-shape electrodes which are arranged such that the teeth portions of the pair of comb-shape electrodes are interdigitated with each other.

Also, each of the IDTs 3a and 3b and the reflectors 4a and 4b has fingers that are arranged substantially perpendicular to the propagation direction of the first SAW device.

In addition, fingers constituting the IDTs 3a and 3b and the reflectors 4a and 4b preferably have a normalized film thickness (H/λ) in the range of about 0.025 to about 0.135.

The longitudinally coupled resonator filter 1 has fingers made mainly from Al that are disposed on the ST-cut 90° X-propagation quartz substrate 2 with an angle θ ranging from about 110° to about 150° of the Euler angles and that have a normalized film thickness (H/λ) in the range of about 0.025 to about 0.135. This configuration allows the SAW device to have an excellent reflection property of the fingers, to have a smaller number of fingers constituting the reflectors 4a and 4b, thereby achieving a device with a substantially reduced overall size. Also, this configuration allows the SAW device to have electrodes, the thickness to have much less of an affect on the frequencies of the SAW device, and accordingly to be much more reliable.

Additionally, compared to a SAW device that is provided with Al electrodes and that uses X-propagation Rayleigh waves, this configuration allows the SAW device to have an electromechanical coupling coefficient that is larger by a factor of about 1.5 or more and to have smaller losses due to a smaller electric resistance of the fingers made mainly from Al. Thus, the SAW device is available over a wider range of operating frequencies.

Figure 5B:
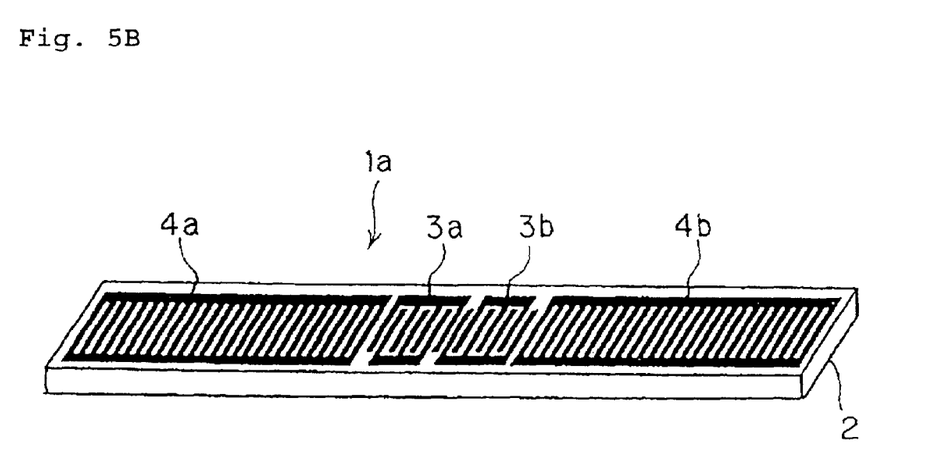

FIG. 5B is a perspective view schematically illustrating a known longitudinally coupled resonator filter 1a (as a comparative example) that has Al electrodes disposed on an ST-cut 0° X-propagation quartz substrate and that uses Rayleigh waves. Like reference numerals in FIG. 5B denote the same elements in FIG. 5A.

As is obvious from FIGS. 5A and 5B, in the longitudinally coupled resonator filter 1 according to the first preferred embodiment, the number of fingers of the reflectors 4a and 4b is much smaller than in the known longitudinally coupled resonator filter 1a.

In the longitudinally coupled resonator filter 1, the reflective index of the fingers is about three times or greater than that of the conventional fingers, thus the number of fingers of the reflectors 4a and 4b required to reflect almost all SAW waves radiated from the IDTs 3a and 3b is much smaller (i.e., one third or less of that of the conventional fingers).

Figure 6:
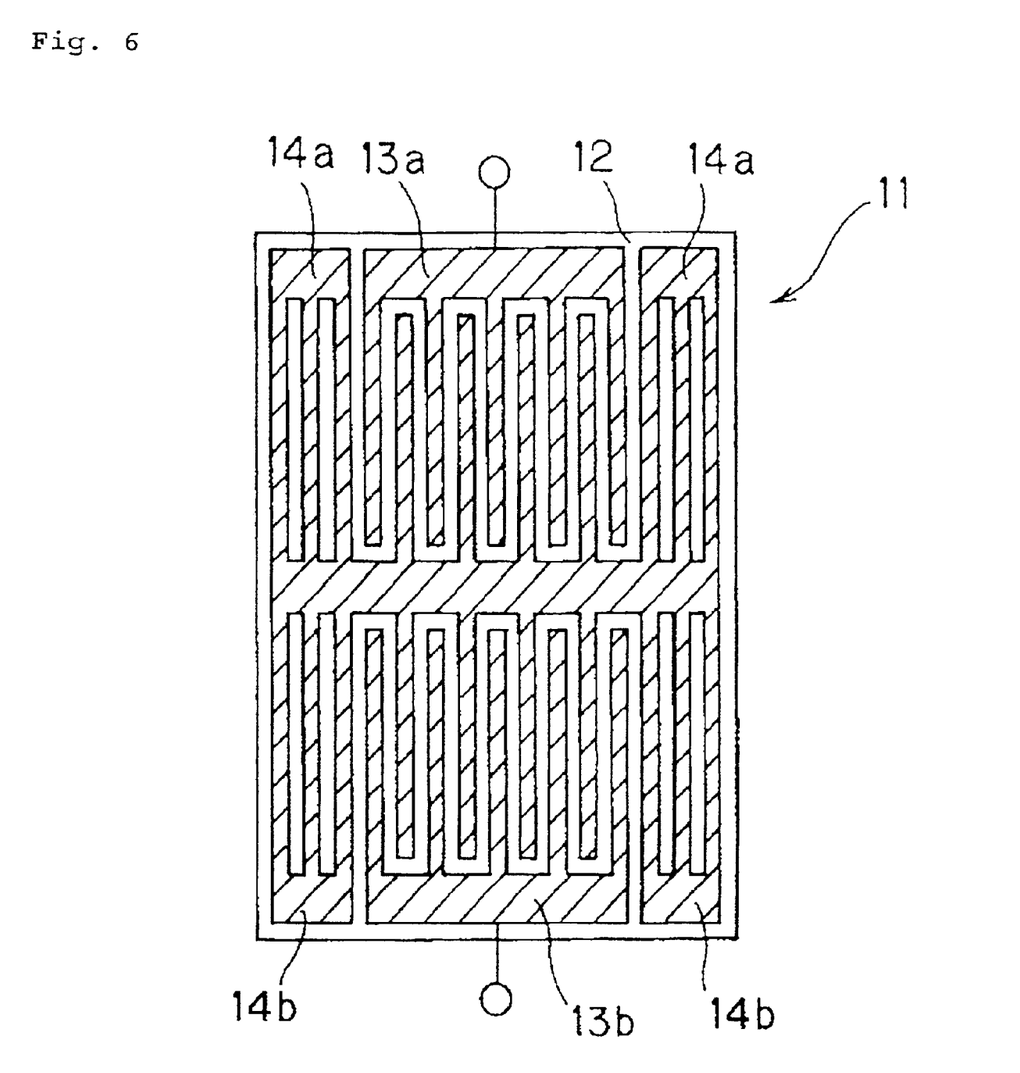
FIG. 6 is a plan view of a transversely coupled SAW filter as a second exemplary SAW device according to a second preferred embodiment of the present invention.

FIG. 6 is a plan view a transversely coupled SAW filter as a second exemplary SAW device according to a second preferred embodiment of the present invention. As shown in FIG. 6, the transversely coupled resonator filter 11 is configured such that two IDTs 13a and 13b for exciting SH waves are disposed on an ST-cut 90° X-propagation quartz substrate (piezoelectric substrate) 12 with the Euler angles (0°, 110–150°, 90°±2°) and two pairs of reflectors 14a and 14b for reflecting the SH waves are arranged so as to sandwich the IDTs 13a and 13b, respectively.

The IDTs 13a and 13b and the reflectors 14a and 14b are preferably made from an electrode material made mainly from Al. Each of the IDTs 13a and 13b has a pair of comb-shape electrodes which are arranged such that the teeth portions of the pair of comb-shape electrodes interdigitate with each other.

Also, each of the IDTs 13a and 13b and the reflectors 14a and 14b has fingers arranged substantially perpendicular to the propagation direction of the second SAW device. In addition, fingers constituting the IDTs 13a and 13b and the reflectors 14a and 14b preferably have a normalized film thickness (H/λ) in the range of about 0.025 to about 0.135.

The transversely coupled SAW filter 11 according to the second preferred embodiment achieves the same advantages as that of the first preferred embodiment.

The present invention also provides a multi-step filter configured by longitudinally connecting a plurality of the first SAW devices shown in FIG. 5A according to the first preferred embodiment or the second SAW devices shown in FIG. 6 according to the second preferred embodiment. The multi-step filter also achieves the same advantages as those of the first and second preferred embodiments.

Figure 7:
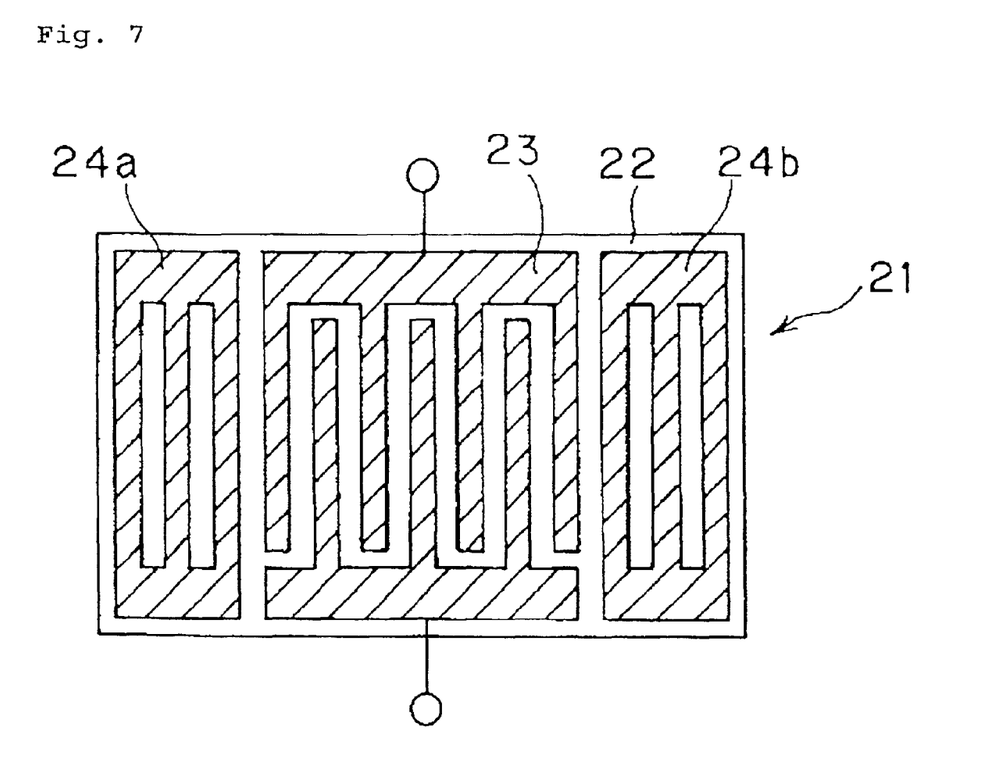
FIG. 7 is a plan view of a SAW resonator as a third exemplary SAW device according to a third preferred embodiment of the present invention.

FIG. 7 is a plan view of a SAW resonator as a third exemplary SAW device according to a third preferred embodiment of the present invention.

As shown in FIG. 7, the SAW resonator 21 is configured such that a single IDT 23 for exciting SH waves is disposed on an ST-cut 90° X-propagation quartz substrate (piezoelectric substrate) 22 with the Euler angles (0°, 110–150°, 90°±2°) and two reflectors 24a and 24b for reflecting the SH waves are arranged so as to sandwich the IDT 23 therebetween.

The IDT 23 and the reflectors 24a and 24b are preferably made from an electrode material made mainly from Al. The IDT 23 has a pair of comb-shape electrodes which are arranged such that the teeth portions of the pair of comb-shape electrodes interdigitate with each other.

Also, fingers constituting the IDT 23 and the reflectors 24a and 24b preferably have a normalized film thickness (H/λ) in the range of about 0.025 to about 0.135.

Figure 8:
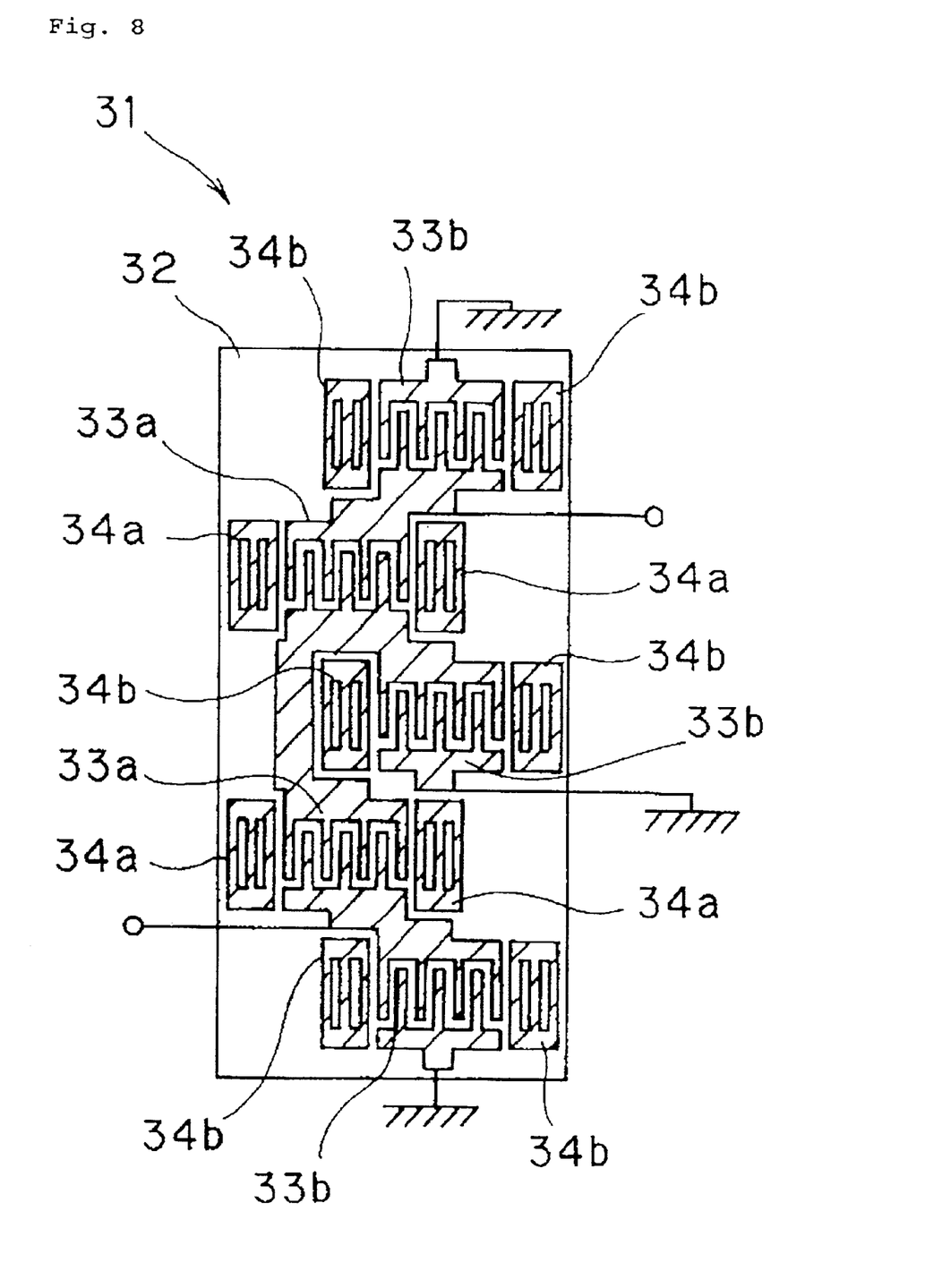
FIG. 8 is a plan view of a SAW ladder filter as a fourth exemplary SAW device according to a fourth preferred embodiment of the present invention.

FIG. 8 is a plan view of a ladder SAW filter as a fourth exemplary SAW device according to a fourth preferred embodiment of the present invention.

As shown in FIG. 8, the ladder SAW filter 31 is configured such that pluralities of IDTs 33a and 33b for exciting SH waves are disposed on an ST-cut 90° X-propagation quartz substrate (piezoelectric substrate) 32 with the Euler angles (0°, 110–150°, 90°±2°) and also pluralities of reflectors 34a and 34b for reflecting the SH waves are disposed so that each pair of the reflectors 34a and 34b sandwiches each of the IDTs 33a and 33b, respectively.

The IDTs 33a and 33b and the reflectors 34a and 34b are preferably made from an electrode material made mainly from Al. Each of the IDTs 33a and 33b has a pair of comb-shape electrodes which are arranged such that the teeth portions of the pair of comb-shape electrodes interdigitate with each other.

The pluralities of IDTs 33a and 33b are arranged in a series arm and parallel arms, respectively, so as to provide a ladder-type SAW device. Likewise in the first to third preferred embodiments, fingers constituting the IDTs 33a and 33b and the reflectors 34a and 34b preferably have a normalized film thickness (H/λ) in the range of about 0.025 to about 0.135 in this preferred embodiment.

The third and fourth SAW devices according to the third and fourth preferred embodiments shown in FIGS. 7 and 8, respectively, achieve the same advantages as those of the first SAW device according to the first preferred embodiment.

In the SAW devices according to the first to fourth preferred embodiments, by configuring the fingers so as to have a normalized film thickness (H/λ) in the range of about 0.045 to about 0.095, the SAW devices have a reflective index per finger equal to about 10% or larger, thereby achieving a reflective index of about 99% or larger by providing the reflectors with about 40 fingers, and resulting in a reduced size. Additionally, the above configuration allows the SAW devices to have an electromechanical coupling coefficient that is larger than that of the comparative SAW device by a factor of about 2 or more, thereby achieving smaller losses and becoming available over a wider range of operating frequencies.

Also, in the SAW devices according to the first to fourth preferred embodiments, by configuring the fingers so as to have a normalized film thickness (H/λ) of about 0.06 or larger, the SAW devices have a larger reflective index per finger, thereby achieving a further larger reflective index and a further reduced size.

Furthermore, in the SAW devices according to the first to fourth preferred embodiments, by configuring the fingers so as to have a normalized film thickness (H/λ) of about 0.10 or larger, the SAW devices have a further larger reflective index per finger, thus virtually achieving the same reduced size as that of an end surface reflection-type SAW device.

By allowing an angle θ of the Euler angles to satisfy the following condition, that is, by allowing the angle θ to lie between the θmin and θmax indicated in FIG. 9, the SAW devices according to the first to fourth preferred embodiments have an excellent frequency temperature coefficient.

$$\theta_{min} \leq \theta \leq \theta_{max}$$

where, $\theta_{max} = 3303.6\ (H/\lambda)^2 - 71.786\ (H/\lambda) + 130.5$, and $$\theta_{min} = 2747.8\ (H/\lambda)^2 - 72.4\ (H/\lambda) + 121.5.$$

Although in the first to fourth preferred embodiments, a SAW resonator and a SAW filter are described as exemplary SAW devices, the present invention is not limited these devices, but are applicable to other types of SAW filters such as a transversal filter and also to other types of SAW devices excluding filters.

Also, the present invention is not limited to the foregoing preferred embodiments, but the shape of a quartz substrate, arrangement of fingers constituting an IDT and reflectors, the number of fingers, normalized film thickness of the fingers and so on can be modified or changed without departing from the scope of the sprit of the present invention.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device, comprising:
   a quartz substrate;
   a plurality of first fingers, disposed on the quartz substrate, constituting an interdigital transducer (IDT) for exciting shear-horizontal waves (SH waves); and
   a plurality of second fingers, disposed on the quartz substrate, for reflecting the SH waves; wherein
   the quartz substrate is an ST-Cut 90° X-propagation quartz substrate with the Euler angles (0°, θ90°±2°), wherein the angle θ lies in the range of about 110° to about 150°, and the first and second fingers are made of a material including Al as a main component, and a normalized film thickness (H/λ) of the first and second fingers is within the range of about 0.040 to about 0.135.

2. The surface acoustic wave device according to claim 1, wherein the normalized film thickness (H/λ) of the first and second fingers is within the range of about 0.045 to about 0.095.

3. The surface acoustic wave device according to claim 1, wherein the normalized film thickness (H/λ) of the first and second fingers is at least about 0.06.

4. The surface acoustic wave device according to claim 1, wherein the normalized film thickness (H/λ) of the first and second fingers is at least about 0.10.

5. The surface acoustic wave according to claim 1, wherein the angle θ of the Euler angles satisfies the following condition:

$\theta_{min} \leq \theta \leq \theta_{max}$ where, $\theta_{max} = 3303.6 (H/\lambda)^2 - 71.786 (H/\lambda) + 130.5$, and $\theta_{min} = 2747.8 (H/\lambda)^2 - 72.4 (H/\lambda) + 121.5$.

6. An electronic device comprising at least one of a surface acoustic wave resonator, a surface acoustic wave resonator filter, a ladder-type surface acoustic wave filter, a surface acoustic wave lattice filter, and a unidirectional element, each including the surface acoustic wave device according to claim 1.

7. The surface acoustic wave device according to claim 1, wherein the frequency temperature coefficient is within the range of about −75 ppm/° C. to about +80 ppm/° C.

8. The surface acoustic wave device according to claim 1, wherein the plurality of second fingers define two reflectors disposed on the quartz substrate so as to sandwich the interdigital transducer.

9. The surface acoustic wave device according to claim 1, wherein the surface acoustic wave device is a transversely coupled surface acoustic wave filter.

10. A surface acoustic wave device, comprising:
a quartz substrate;
at least one interdigital transducer disposed on the quartz substrate for exciting shear-horizontal waves; and
a plurality of reflectors disposed on the quartz substrate for reflecting the shear-horizontal waves; wherein
the quartz substrate is an ST-cut 90° X-propagation quartz substrate with the Euler angles (0°, θ, 90°±2°), wherein the angle θ lies in the range of about 110° to about 150°, and the first and second fingers are made of a material including Al as a main component, and a normalized film thickness (H/λ) of the first and second fingers is within the range of about 0.040 to about 0.135.

11. The surface acoustic wave device according to claim 10, wherein the normalized film thickness (H/λ) of the first and second fingers is within the range of about 0.045 to about 0.095.

12. The surface acoustic wave device according to claim 10, wherein the normalized film thickness (H/λ) of the first and second fingers is at least about 0.06.

13. The surface acoustic wave device according to claim 10, wherein the normalized film thickness (H/λ) of the first and second fingers is at least about 0.10.

14. The surface acoustic wave according to claim 10, wherein the angle θ of the Euler angles satisfies the following condition:

$\theta_{min} \leq \theta \leq \theta_{max}$ where, $\theta_{max} = 3303.6 (H/\lambda)^2 - 71.786 (H/\lambda) + 130.5$, and $\theta_{min} = 2747.8 (H/\lambda)^2 - 72.4 (H/\lambda) + 121.5$.

15. An electronic device comprising at least one of a surface acoustic wave resonator, a surface acoustic wave resonator filter, a ladder-type surface acoustic wave filter, a surface acoustic wave lattice filter, and a unidirectional element, each including the surface acoustic wave device according to claim 10.

16. The surface acoustic wave device according to claim 10, wherein the frequency temperature coefficient is within the range of about −75 ppm/° C. to about +80 ppm/° C.

17. The surface acoustic wave device according to claim 10, wherein the plurality of second fingers define two reflectors disposed on the quartz substrate so as to sandwich the interdigital transducer.

18. The surface acoustic wave device according to claim 10, wherein the surface acoustic wave device is a transversely coupled surface acoustic wave filter.

* * * * *